United States Patent
Hess et al.

(10) Patent No.: US 10,833,664 B2
(45) Date of Patent: Nov. 10, 2020

(54) SUPPLY TRACKING DELAY ELEMENT IN MULTIPLE POWER DOMAIN DESIGNS

(71) Applicant: Apple Inc., Cupertino, CA (US)

(72) Inventors: Greg M. Hess, Mountain View, CA (US); Hemangi U. Gajjewar, Sunnyvale, CA (US); Sachmanik Cheema, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 21 days.

(21) Appl. No.: 15/676,752

(22) Filed: Aug. 14, 2017

(65) Prior Publication Data
US 2019/0052254 A1 Feb. 14, 2019

(51) Int. Cl.
*H03K 5/159* (2006.01)
*H03K 19/0175* (2006.01)
*H03K 5/00* (2006.01)
*G06F 30/30* (2020.01)

(52) U.S. Cl.
CPC ..... *H03K 5/159* (2013.01); *H03K 19/017509* (2013.01); *G06F 30/30* (2020.01); *H03K 2005/00019* (2013.01)

(58) Field of Classification Search
CPC ....... G06F 17/00; G06F 17/5045; G11C 7/00; G11C 7/22; H03K 19/00; H03K 19/017509; H03K 2005/00; H03K 2005/00019; H03K 5/00; H03K 5/131; H03K 5/132; H03K 5/133; H03K 5/135; H03K 5/159
USPC ....................................................... 327/277
See application file for complete search history.

(56) References Cited

U.S. PATENT DOCUMENTS

| | | | |
|---|---|---|---|
| 4,550,405 A | 10/1985 | West | |
| 5,424,985 A * | 6/1995 | McClure | G11C 7/06 365/189.09 |
| 5,479,129 A | 12/1995 | Fernandez | |
| 5,796,284 A | 8/1998 | Clemen | |
| 5,949,292 A | 9/1999 | Fahrenbruch | |
| 8,004,337 B2 | 8/2011 | Brannen | |
| 8,559,247 B2 | 10/2013 | Shin | |
| 2012/0294095 A1* | 11/2012 | Shiu | G11C 7/1057 365/189.11 |
| 2013/0293282 A1* | 11/2013 | Rotem | H03K 17/687 327/427 |
| 2014/0266347 A1* | 9/2014 | Iyer | H03L 7/10 327/158 |
| 2018/0218108 A1* | 8/2018 | Rao | G06F 17/5081 |

* cited by examiner

*Primary Examiner* — Lincoln D Donovan
*Assistant Examiner* — Dave Mattison
(74) *Attorney, Agent, or Firm* — Meyertons, Hood, Kivlin, Kowert & Goetzel, P.C.

(57) ABSTRACT

An apparatus for delaying a signal transition is disclosed. The apparatus includes a first circuit coupled to a first power supply signal and a second, different power supply signal. The first circuit may be configured to, based on a voltage level of a logic signal, sink a current from an intermediate circuit node. A value of the current may be based upon a voltage level of the second different power supply signal. The apparatus also includes a second circuit coupled to the first power supply signal. The second circuit may be configured to generate an output signal based upon a voltage level of the intermediate circuit node. An amount of time between a transition of the logic signal and a corresponding transition of the output signal may be based on an amount of the current.

20 Claims, 9 Drawing Sheets

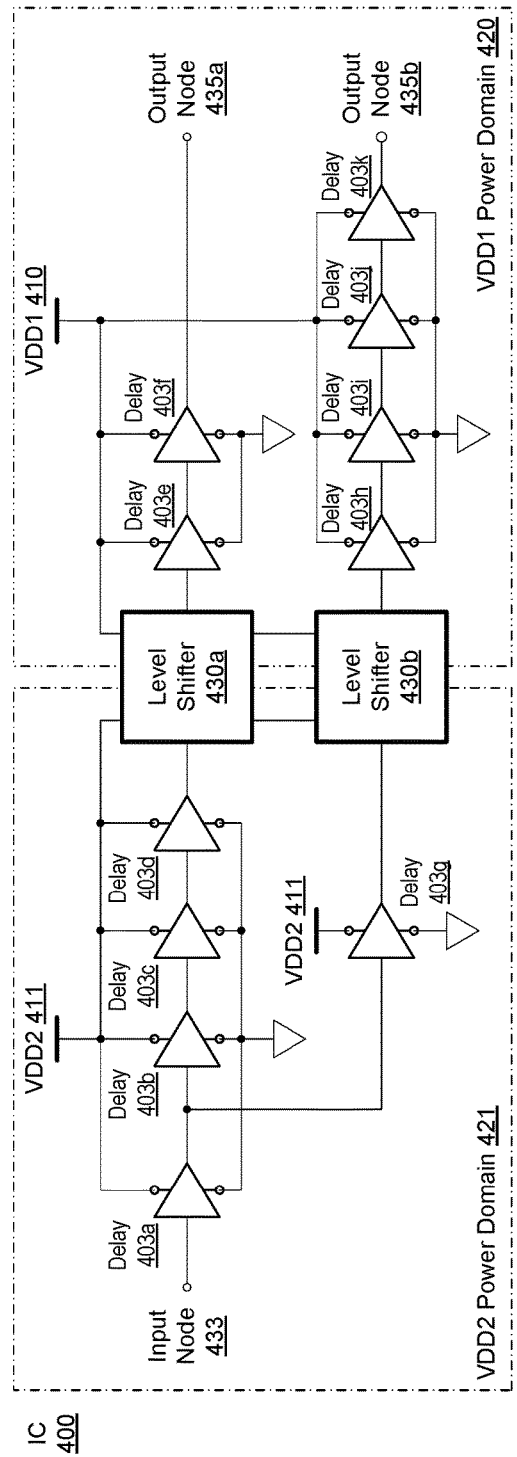
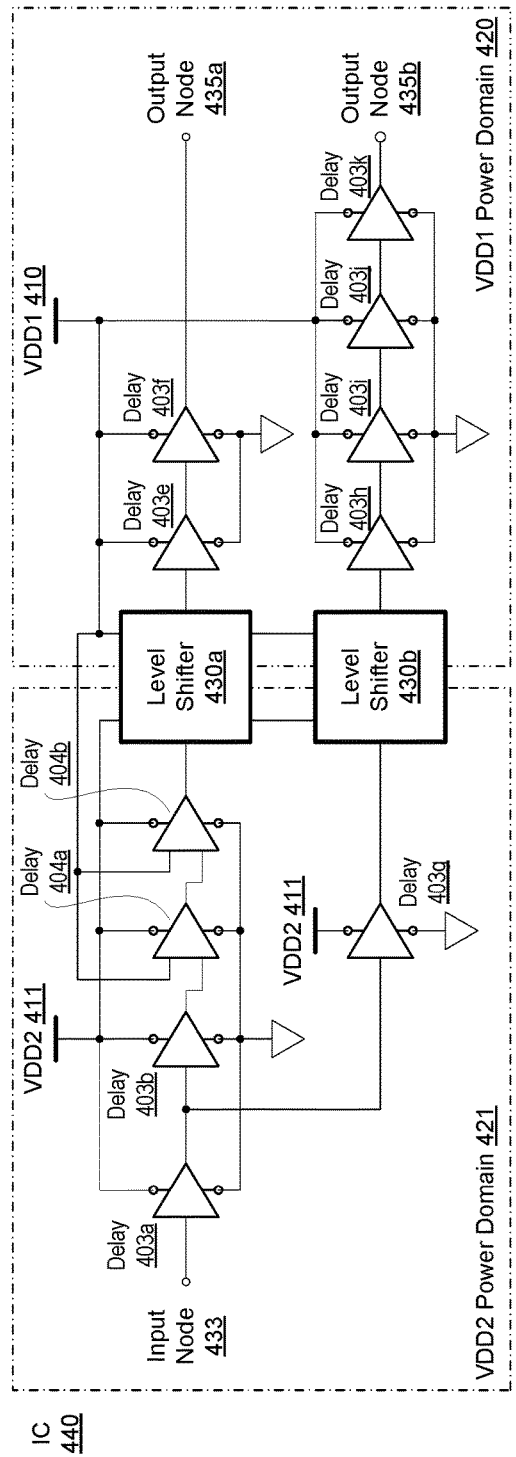
FIG. 4A
FIG. 4B

SUPPLY TRACKING DELAY ELEMENT IN MULTIPLE POWER DOMAIN DESIGNS

BACKGROUND

Technical Field

Embodiments described herein relate to integrated circuits, and more particularly, to techniques for delaying a signal in a system with multiple power domains.

Description of the Related Art

Processors, memories, and other types of integrated circuits (ICs), typically include a number of logic circuits composed of interconnected transistors fabricated on a semiconductor substrate. Such logic circuits may be constructed according to a number of different circuit design styles. For example, combinatorial logic may be implemented via a collection of un-clocked static complementary metal-oxide semiconductor (CMOS) gates situated between clocked state elements such as flip-flops or latches. Alternatively, depending on design requirements, some combinatorial logic functions may be implemented using clocked dynamic logic, such as domino logic gates.

Wires formed from metallization layers available on a semiconductor manufacturing process may be used to connect the various clocked state elements and logic gates. Manufacturing variation from chip to chip as well as differences in physical routing of the wires may result in different propagation times between logic gates.

In addition, some IC may include more than one power domain, i.e., circuitry that is coupled to a same power supply node. For example, an IC may include one power supply node for a processing core and associated functional circuits and another power supply node for a memory and circuits associated with the memory. Propagation delays may differ for circuits coupled to each power supply node, particularly if the power supply nodes have different voltage levels. Signals travelling across voltage domains may have delay times that are dependent on the voltage level of each power domain.

SUMMARY OF THE EMBODIMENTS

Various embodiments of systems and methods for delaying signal propagation in a multiple power domain circuit are disclosed. Broadly speaking, an apparatus is contemplated in which the apparatus may include a first circuit, coupled to a first power supply signal and a second, different power supply signal. The first circuit may be configured to, based on a voltage level of a logic signal, sink a current from an intermediate circuit node. A value of the current may be based upon a voltage level of the second different power supply signal. The apparatus also includes a second circuit coupled to the first power supply signal. The second circuit may be configured to generate an output signal based upon a voltage level of the intermediate circuit node. An amount of time between a transition of the logic signal and a corresponding transition of the output signal may be based on an amount of the current.

In a further embodiment, the first circuit may include a first device coupled to the intermediate circuit node. The first device may be controlled by the voltage level of the second different power supply signal. In another embodiment, the first circuit may include a first device coupled to the intermediate circuit node, and a second device coupled to the first device and a ground node. The second device may be controlled by the voltage level of the second different power supply signal.

In one embodiment, to generate an output signal based upon a voltage level of the intermediate circuit node, the second circuit may be further configured to sink another current from an output circuit node. A value of the another current may be based upon the voltage level of the second different power supply signal. In a further embodiment, the first circuit may be further configured to sink the current from the intermediate circuit node in response to a rising transition of the logic signal.

In another embodiment, the first circuit is further configured to source another current to the intermediate circuit node in response to a falling transition of the logic signal. A value of the another current is based upon a voltage level of the first power supply signal. In an embodiment, the first circuit may be further configured to generate the output signal with a voltage level between a ground voltage level and a voltage level of the first power supply signal.

BRIEF DESCRIPTION OF THE DRAWINGS

The following detailed description makes reference to the accompanying drawings, which are now briefly described.

FIG. 4A depicts a block diagram of an embodiment of an IC including signal paths from one input signal to two output signals.

FIG. 4B shows a block diagram of another embodiment of an IC including signal paths from one input signal to two output signals.

Figure 1A:
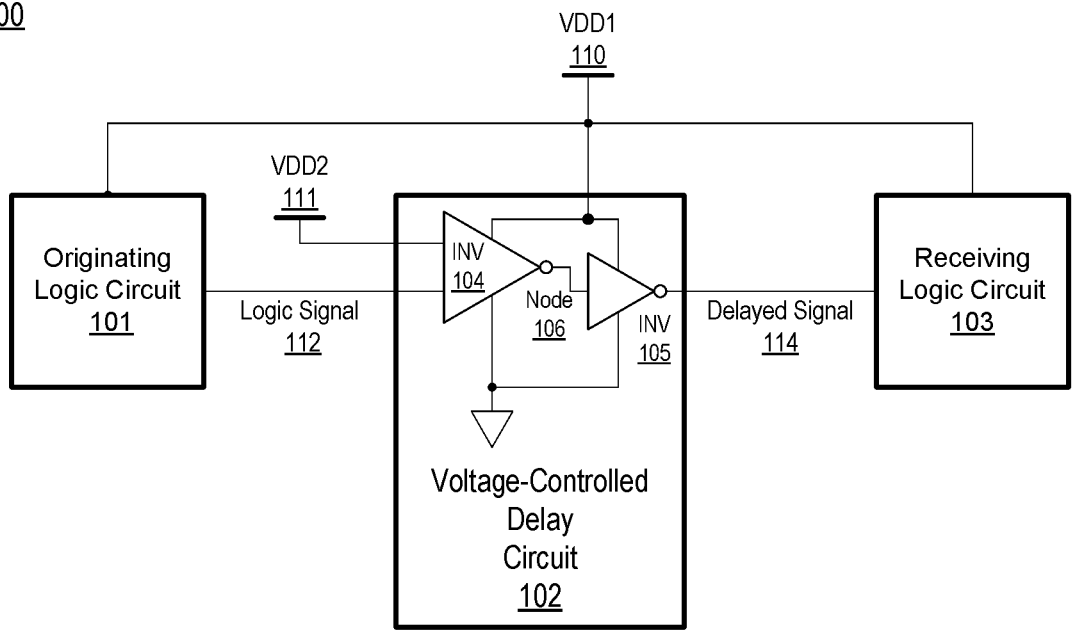
FIG. 1A illustrates a block diagram of a portion of an embodiment of an IC.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION OF EMBODIMENTS

An integrated circuit (IC) may include various digital circuits as well as two or more power domains. As used herein, a "power domain" refers to a circuit, sub-circuit, or plurality of circuits that receive power from a common power supply node. Logic signals, such as, e.g., clock signals, enable signals, and the like, may propagate through two or more power domains. Such signals may also "fan out," i.e., take divergent paths from a common circuit node, to be received by various circuits. In such cases, care may be taken by a circuit designer to mitigate propagation delays via the various paths in order to have transitions of a particular logic signal arrive at the various circuits at approximately the same time, or arrive at the circuits before or after a particular event, such as, e.g., a rising or falling edge of a clock signal, a transition of an enabler signal, etc. If, for example, an enable signal fans out to two paths, and one of the paths crosses into another power domain, a voltage difference between the originating power domain and the other power domain may cause a difference in propagation times. This difference in propagation times may change based on the amount of voltage difference between the two power domains.

The embodiments illustrated in the drawings and described below may provide various techniques for designing a delay circuit element in a first power domain with a delay time that tracks a voltage level of a second power domain. These embodiments include a delay element that may not receive power from the second power domain.

A block diagram of several circuits in an IC is illustrated in FIG. 1A. In the illustrated embodiment, IC 100 includes Sending Logic Circuit 101 coupled to Voltage-Controlled Delay Circuit 102, which is, in turn, coupled to Receiving Logic Circuit 103. Voltage-Controlled Delay Circuit 102 includes inverting circuits (INV) 104 and 105. Power is supplied to all illustrated circuits from power node VDD1 110. In various embodiments, IC 100 may be configured for use in various computing applications such as, e.g., desktop computers, laptop computers, tablet computers, smartphones, or wearable devices.

Originating Logic Circuit 101 may correspond to any suitable logic circuit capable of generating a logic signal. In the illustrated embodiment, Logic Signal 112 is generated by Originating Logic Circuit 101 and is received, as Delayed Signal 114, by Receiving Logic Circuit 103. Transitions of Logic Signal 112 are delayed by some amount of time (referred to herein as a "delay time") by Voltage-Controlled Delay Circuit 102. Voltage-Controlled Delay Circuit 102 receives Logic Signal 112 and generates Delayed Signal 114 using Logic Signal 112. The amount of the delay time may vary for different transitions on Logic Signal 112. For example, falling transitions on Logic Signal 112 may be delayed for a longer amount of time than rising transitions, or vice versa. In addition, the delay time may vary based on a current voltage level of VDD1 110 and/or a current temperature of IC 100. Logic Signal 112 may be delayed on its path to Receiving Logic Circuit 103 for any of a number of reasons. For example, Logic Signal 112 may be delayed such that transitions occur after a rising or falling edge of a clock signal or enable/disable signal in Receiving Logic Circuit 103, or to provide an adequate time for an analog signal to reach a particular voltage level, or to mitigate other timing constraints.

In the illustrated embodiment, Voltage-Controlled Delay Circuit 102 includes inverting circuits INV 104 and INV 105. INV 104 receives Logic Signal 112 as an input and INV 105 generates Delayed Signal 114 at an output node, with values corresponding to the values of Logic Signal 112, except transitions between high and low values are delayed. Each of INVs 104 and 105 may increase the delay time of the propagation of Logic Signal 112 through Voltage-Controlled Delay Circuit 102. INV 105 may be implemented as any suitable inverting circuit, and may be designed to add a particular amount of delay time under certain operating conditions. The particular amount of delay time added by INV 105 may influenced by a voltage level of VDD1 110. For example, lower voltage levels of VDD1 110 may increase the amount of delay time and higher voltage levels decrease the delay time.

INV 104, in the illustrated embodiment, receives power supply signal VDD2 111 as an input, as well as Logic Signal 112. INV 104, similar to INV 105, may be designed to add a particular amount of delay time under certain operating conditions, and may likewise have a similar relationship between VDD1 110 and the added delay time. Using the received VDD2 111 as an input, rather than as a power source, INV 104 may increase or decrease the added delay time for Logic Signal 112 to propagate through to Node 106 based on a voltage level of VDD2 111. In some embodiments, the voltage level of VDD2 111 may influence delay times for both rising and falling transitions of Logic Signal 112, while in other embodiments, VDD2 111 may influence only rising or falling transitions.

Figure 1B:
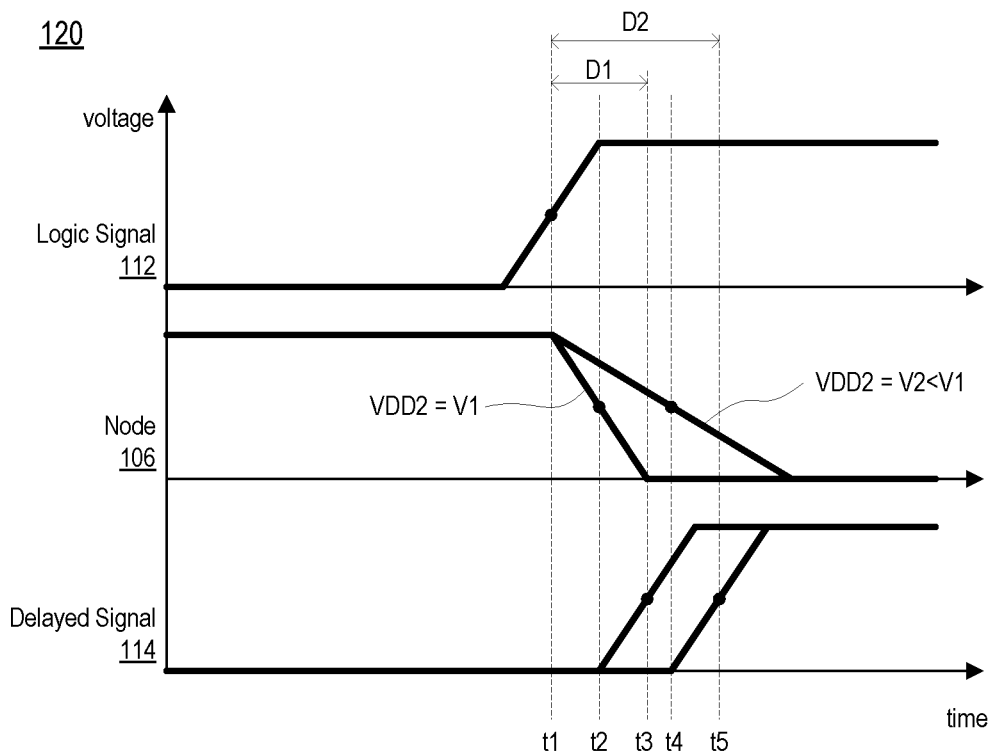
FIG. 1B shows a chart representing an example of signal delays in the IC of FIG. 1A.

An example of the influence of the level of VDD2 111 on the delay time through INV 104 is shown in FIG. 1B. Chart 120 in FIG. 1B illustrates voltage level versus time for three signals; Logic Signal 112, an intermediate signal on Node 106, and Delayed Signal 114.

The three signals start with Logic Signal 112 and Delayed Signal 114 both at low logic levels, and Node 106 at a high logic level. Logic Signal 112 begins a transition to a high logic level and at time t1, reaches a threshold voltage level that causes INV 104 to begin to transition to a low level. Two examples of the reaction of INV 104 and INV 105 are shown. The first example reflects VDD2 111 at a first voltage level, V1. The second example reflects VDD2 111 at a second voltage level, V2, lower than V1.

When VDD2 111 is at voltage level V1, the output of INV 104, at Node 106, transitions with a faster slew rate. At time t2, the level of Node 106 reaches a threshold voltage level of INV 105, causing Delayed Signal 114 to begin to transition to a high level. At time t3, Delayed Signal 114 reaches a threshold voltage level that may be recognized as a high logic level by Receiving Logic Circuit 103. The delay time from when Logic Signal 112 may be recognized as a logic high to when Delayed Signal 114 may be recognized as a high is indicated as D1.

When VDD2 111 is at the lower V2 voltage level, the output of INV 104 transitions with a lower slew rate than when VDD2 111 is at V1. Due to the slower slew rate, Node 106 does not reach the threshold voltage level until time t4. Accordingly, Delayed Signal 114 does not reach the threshold voltage level until time t5. The delay time for Voltage-Controlled Delay Circuit 102 in this case is indicated as D2, with D2 being noticeably longer than D1 in this example.

It is noted that, the delay time for INV 105 does not change due to the voltage level change of VDD2 111 from V1 to V2. The delay added by INV 105 (t2 to t3, and t4 to t5) remains substantially the same in both examples. The difference between D1 and D2 may be attributed to the increased delay time of INV 104 when VDD2 111 is at V2 versus V1. The delay time for Delay Circuit 102, therefore, may track with a voltage level of VDD2 111. Since Delay Circuit 102 receives VDD2 111 as an input signal, and not as a power signal, Delay Circuit 102 may be used within a circuit that is powered by VDD1 110 without a level shifting circuit being used to transfer a logic signal from the VDD2 111 voltage domain into the VDD1 110 voltage domain. Delay Circuit 102 may, therefore, add a delay time dependent on VDD2 111 to a signal path in the VDD1 voltage domain without using a level shifter.

Circuits described above and herein may, in various embodiments, be implemented using devices corresponding to metal-oxide semiconductor field-effect transistors (MOS-FETs), or to any other suitable type of transconductance device. As used and described herein, a "low logic level," "low," or a "logic 0 value," corresponds to a voltage level sufficiently low to enable a p-channel MOSFET, and a "high logic level," "high," or a "logic 1 value," corresponds to a voltage level sufficiently high to enable an n-channel MOSFET. In various other embodiments, different technology, including technologies other than complementary metal-oxide semiconductor (CMOS), may result in different voltage levels for "low" and "high." A "logic signal," as used herein, may correspond to a signal generated in a CMOS, or other technology, circuit in which the signal transitions between low and high logic levels.

It is noted IC 100 in FIG. 1A and chart 120 in FIG. 1B are merely examples. In other embodiments of IC 100, additional circuit blocks and different configurations of circuit blocks may be implemented dependent upon the specific application for which the IC is intended. The signals shown in FIG. 1B have been simplified for clarity. Actual waveforms associated with the circuits of IC 100 may include various fluctuations due to system and environmental noise signals generated by other circuits in IC 100 or other electronic devices near IC 100.

Figure 2A:
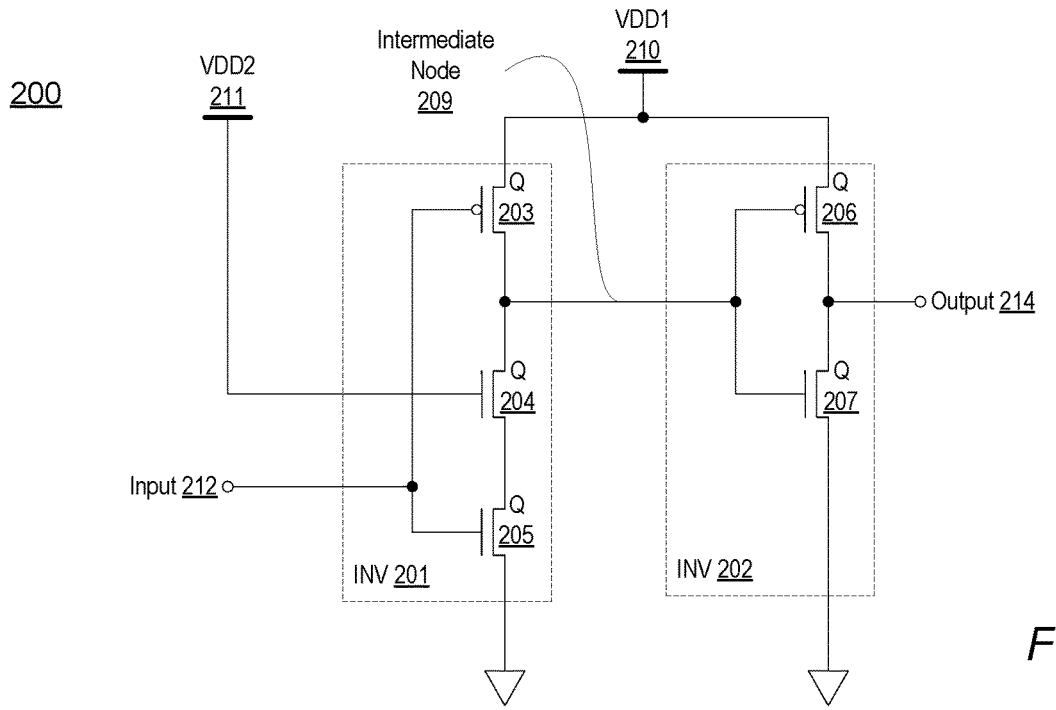
FIG. 2A illustrates a first embodiment of a delay circuit.
Figure 2B:
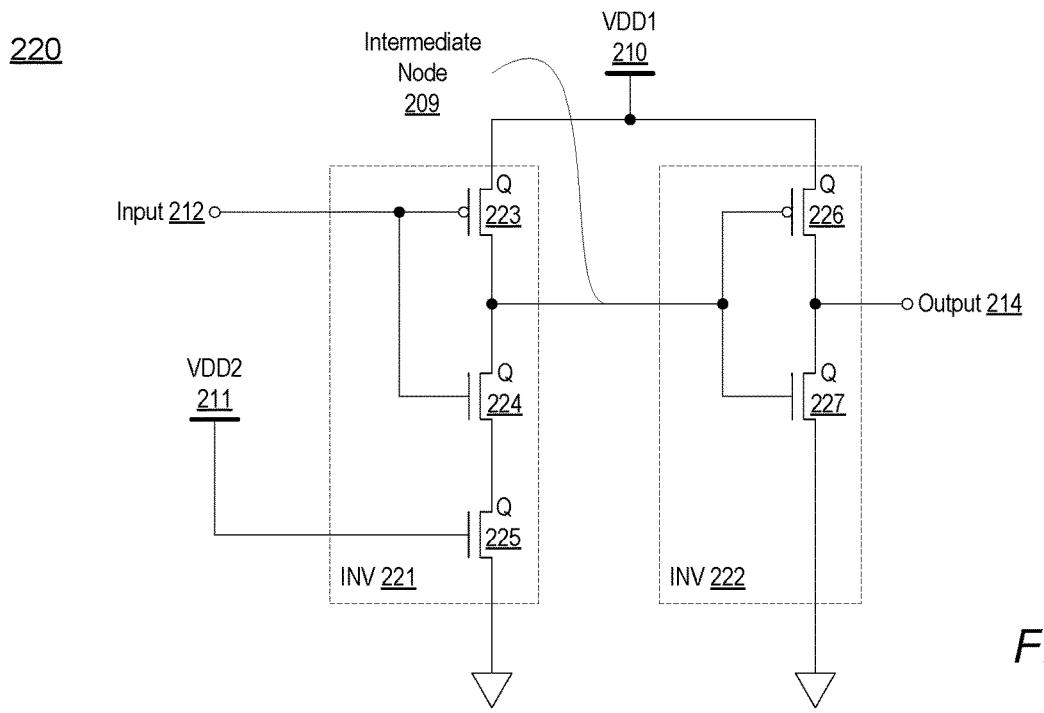
FIG. 2B shows a second embodiment of a delay circuit.

Turning to FIGS. 2A and 2B, two embodiments of a voltage-controlled delay circuit are depicted. In various embodiments, Voltage-Controlled Delay Circuits 200 and 220 may each correspond to Voltage-Controlled Delay Circuit 102 in FIG. 1A. Each of Voltage-Controlled Delay Circuits 200 and 220 receives power from power signal VDD1 210, and receives as inputs power signal VDD2 211 and Input Signal 212. Each circuit also generates Output Signal 214 as an output.

In the illustrated embodiment of FIG. 2A, Voltage-Controlled Delay Circuit 200 includes two inverting sub-circuits, INV 201 and INV 202. INV 201, which in some embodiments may correspond to INV 104 in FIG. 1A, includes devices Q203, Q204, and Q205. INV 202 may, in some embodiments, correspond to INV 105 in FIG. 1A, and includes devices Q206 and Q207. The devices illustrated in FIGS. 2A and 2B are depicted as n-channel or p-channel MOSFETs, although, in other embodiments any suitable transconductive device may be used.

The MOSFET devices shown in FIGS. 2A and 2B, under certain conditions, may act as switches, allowing current to flow from a source terminal to a drain terminal when an appropriate voltage level is applied to the gate terminal. The path from the source to the drain of each device has an associated resistance when enabled, referred to herein as an "on-resistance." This on-resistance may contribute to a slew rate of signals generated by the inverting sub-circuits when their outputs are transitioning, and therefore to a delay time of Voltage-Controlled Delay Circuits 200 and 220, as illustrated in FIG. 1B.

INV 202 receives a signal on Intermediate Node 209 and inverts the logic level of the signal as Output Signal 214. Devices Q206 and Q207 may be designed to have similar threshold voltage levels, such that a voltage level on Intermediate Node 209 that is above the threshold level enables device Q207 and disables device Q206, allowing device Q207 to sink current from Output Signal 214. When the voltage level is below the threshold, device Q207 is disabled and device Q206 is enabled and sources current to Output Signal 214. The on-resistances of Q206 and Q207 may be selected to allow a particular amount of current flow, and thereby impart a particular delay time though INV 202 under a particular set of voltage and temperature conditions. Since INV 202 receives power from VDD1 210, a voltage level of VDD1 210 may also influence a delay time for a transition on Intermediate Node 209 to result in a corresponding transition on Output Signal 214.

INV 201 receives Input Signal 212, as well as VDD2 211. In a similar manner as INV 202, INV 201 inverts the logic level of Input Signal 212 as a signal on Intermediate Node 209. INV 201 includes devices Q203, Q204, and Q205. Devices Q203 and Q205 may perform similar functions as Q206 and Q207, respectively, selectively sourcing and sinking current to and from Intermediate Node 209. The addition of Q204 may create a dependence within INV 201 on the voltage level of VDD2 211. If the voltage level of VDD2 211 is well above the threshold voltage of Q204, then INV 201 may function similarly to INV 202, and may, in some embodiments, have a similar delay time. As the voltage level of VDD2 211 drops closer to the threshold voltage of Q204, then the on-resistance of Q204 may increase, thereby limiting an amount of current that passes through Q205 when enabled. Limiting the current through Q205 may increase the delay time through INV 201 when Input Signal 212 transitions high and Intermediate Node 209 is, accordingly, pulled low though Q204 and Q205. If, however, Input Signal 212 transitions from high to low, then Q205 is disabled and the on-resistance of Q204 may not impact the slew rate of a signal at Intermediate Node 209 as it is pulled high through Q203. In such a case, delay times for falling transitions may not be the same as for rising transitions through INV 201.

FIG. 2B shows another embodiment of a delay circuit. In the illustrated embodiment Voltage-Controlled Delay Circuit 220 includes inverting sub-circuits, INV 221 and INV 202. INV 202 is the same as for Voltage-Controlled Delay Circuit 200. INV 221 illustrates a variation to INV 201. INV 221 includes devices Q223, Q224, and Q225, with the bottom device of the three devices coupled to VDD2 211. In INV 201, the middle device of the three devices (Q203 to Q205) is coupled to VDD2 211. Functionally, INV 221 may perform similar to INV 201. A choice to use INV 201 or INV 221 in a particular circuit may be based on, among other considerations, an ease of routing VDD2 211 to the inverting circuit.

It is noted that the delay circuits depicted in in FIGS. 2A and 2B are examples intended to demonstrate concepts disclosed herein. To improve clarity, other circuit elements that may be included in a delay circuit have been omitted. In other embodiments, any number of other circuit elements, such as, e.g., capacitors or additional devices, may be included. Two such additional embodiments are shown in FIGS. 3A and 3B.

Figure 3A:
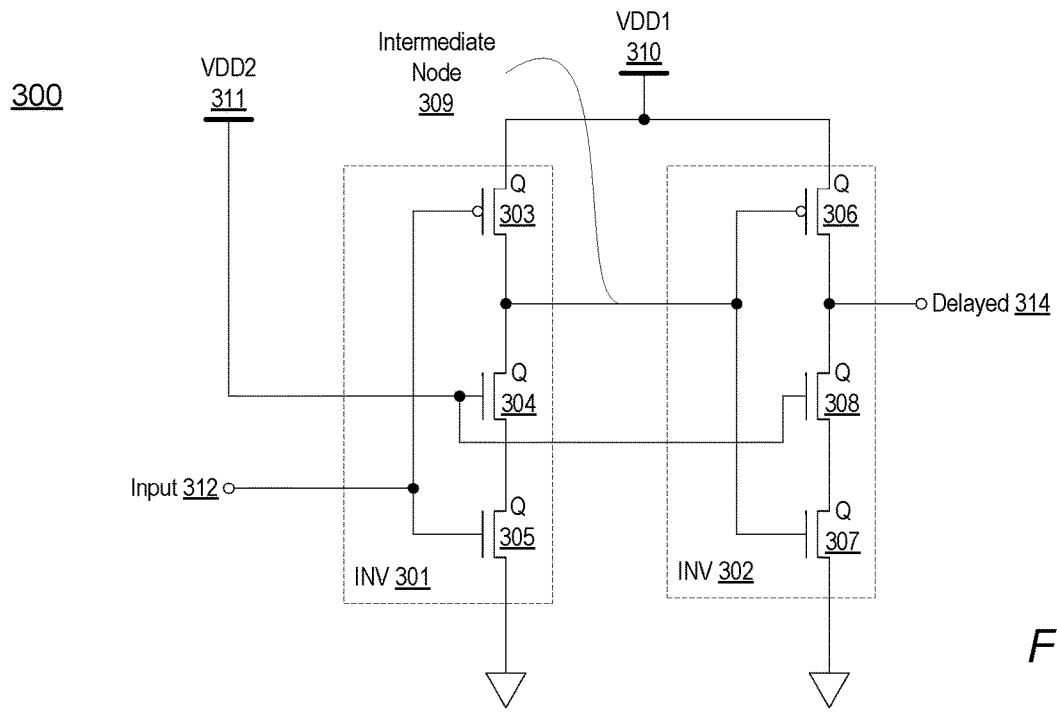
FIG. 3A depicts a third embodiment of a delay circuit.
Figure 3B:
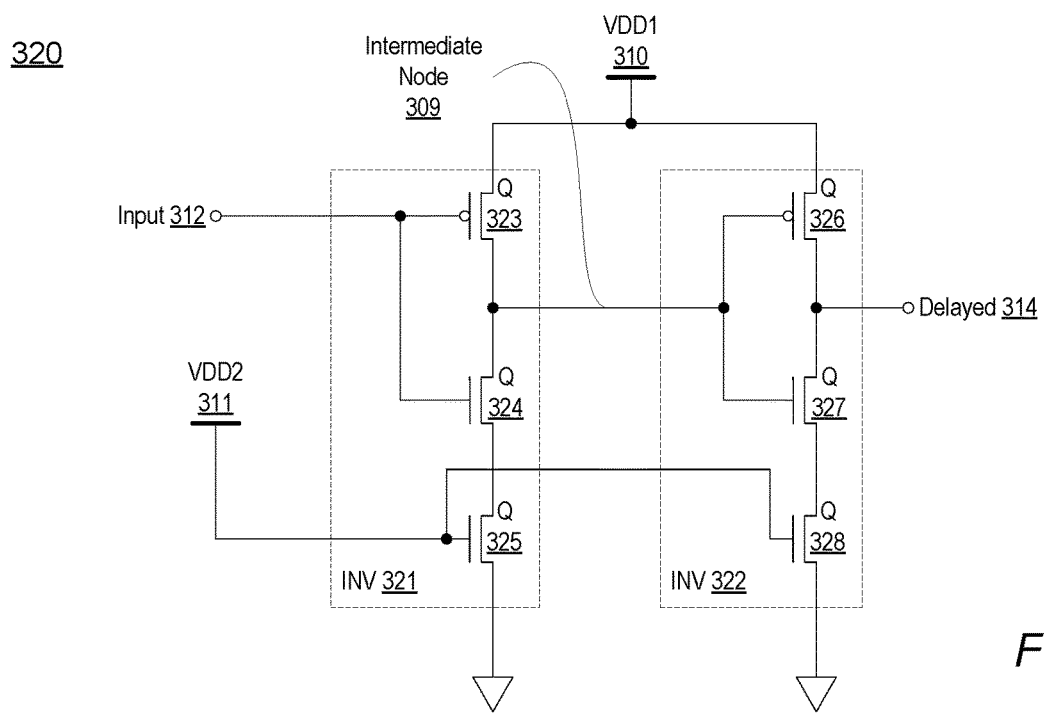
FIG. 3B illustrates a fourth embodiment of a delay circuit.

Proceeding now to FIGS. 3A and 3B, two more embodiments of a voltage-controlled delay circuit are depicted. As stated above, the delay times through Voltage-Controlled Delay Circuits 200 and 220 in FIGS. 2A and 2B may not, in some embodiments, result in similar delay times for rising and falling transitions of Input Signal 212. The circuits illustrated in FIGS. 3A and 3B may, in some embodiments, provide similar delay times for both rising and falling transitions of an input signal. Voltage-Controlled Delay Circuit 300 includes inverting circuits, INV 301 and INV 302. Voltage-Controlled Delay Circuit 320 similarly includes inverting circuits, INV 321 and INV 322.

Voltage-Controlled Delay Circuit 300 is similar to Voltage-Controlled Delay Circuit 200, with devices Q303 through Q307 corresponding to similarly named and numbered components in Voltage-Controlled Delay Circuit 200. In the illustrated embodiment, INV 301 functions per the description of INV 201. Device Q308 has been added to INV 302, with the gate terminal of device Q308 coupled to VDD2 311, making INV 302 a similar circuit design to INV 301. Delay times for falling transitions on Input Signal 312 may not be influenced by a voltage level of VDD2 311, while rising transitions through INV 301 are influenced due to an on-resistance of device Q304. After the associated delay time of transitions on Input Signal 312, a logic value of Intermediate Node 309, driven by INV 301, is inverted from a logic value of Input Signal 312.

INV 302 functions similarly to INV 301. Accordingly, delay times for rising transitions on Intermediate Node 309 are influenced by a voltage level of VDD2 311, while falling transitions through INV 301 may not be influenced by VDD2 311. Since each of INV 301 and INV 302 invert their respective output signal in respect to their respective input signals, a delay time through Voltage-Controlled Delay Circuit 300 may be similar regardless if Input Signal 312 has a rising, or falling, transition. For example, if Input Signal 312 has a falling transition, then INV 301 may not influence the delay time to Output Signal 314 based on a voltage level of VDD2 311, but INV 302 may have a delay time based at least in part on the voltage of VDD2 311. Rising transitions may be delayed based at least partially due to the voltage of VDD2 311 within INV 301, rather than INV 302.

Similar to Voltage-Controlled Delay Circuit 220 in FIG. 2B, Voltage-Controlled Delay Circuit 320 illustrates a variation to Voltage-Controlled Delay Circuit 300. INV 321 and INV 322 are similar designs to each other and demonstrate another embodiment of a delay circuits such as, e.g., INVs 301 or 302. INVs 321 and 322, in the illustrated embodiment, function similarly to INVs 301 and 302. During the design of an IC, the choice to use delay circuits such as INV 301/302 versus INV 321/322 may be based on, among other considerations, an ease of routing VDD2 311 to the inverting circuit.

Turning now to FIG. 4A, a block diagram of an embodiment of an IC including signal paths from one input signal to two output signals is illustrated. IC 400 demonstrates an input signal branching into two signal paths leading to two output nodes. As used herein, a "signal path" refers to the one or more circuit nodes and components that lie between an input signal and an output signal based on the input signal. In the illustrated embodiment, IC 400 includes Delay Circuits 403*a-k* (referred to collectively as Delay Circuits 403), and Level Shifters 430*a-b*. A first portion of IC 400 is powered by VDD2 411 in VDD2 Power Domain 421, while another portion is powered by VDD1 410 in VDD1 Power Domain 420.

An input signal is received on Input Node 433 within VDD2 Power Domain 421 by Delay Circuit 403*a*. Delay Circuits 403 may, in various embodiments, correspond to any suitable inverting circuit, such as, for example, buffers, inverter circuits, or other types of logic gates. The output of Delay Circuit 403*a* branches to the inputs of Delay Circuits 403*b* and 403*g*. The output of Delay Circuit 403*b* goes to Delay Circuit 403*c*, while the output of Delay Circuit 403*g* goes to Level Shifter 430*b* to be transferred to VDD1 Power Domain 420. The output of Delay Circuit 403*c* remains in VDD2 Power Domain 421, passing through Delay Circuit 403*d* before reaching Level Shifter 430*a*. The output of Level Shifter 430*a*, now in VDD1 Power Domain 420, passes through Delay Circuits 403*e-f* before reaching Output Node 435*a*. Level Shifter 430*b* generates an output signal in VDD1 Power Domain 420, which then passes through Delay Circuits 403*h-k* before reaching Output Node 435*b*.

Each of the two signal paths from Input Node 433 to respective Output Nodes 435*a-b* include six delay circuits as well as one level shifter. The path to Output Node 435*a* includes four delay circuits in VDD2 Power Domain 421 (Delay Circuits 403*a-d*) and two in VDD1 Power Domain 420 (Delay Circuits 403*e-f*). In contrast, the path to Output Node 435*b* includes two delay circuits in VDD2 Power Domain 421 (Delay Circuits 403*a* and 403*g*) and four in VDD1 Power Domain 420 (Delay Circuits 403*h-k*). If the voltage levels of VDD2 411 and VDD1 410 are substantially the same, then the overall delay time from Input Node 433 to Output Nodes 435*a-b* may be substantially the same. If, however, the voltage levels of the two power supply signals are different, then the delay times may skew longer through the delay circuits in the power domain with the lower voltage level.

For example, if VDD1 410 is at a lower voltage level, then the delay times through Delay Circuits 403*e-f* and 403*h-k* may be longer than the delay times of the respective delay circuits in VDD2 Power Domain 421. Since the path to Output Node 435*a* includes two delay circuits in VDD1 Power Domain 420 while the path to Output Node 435*b* includes four delay circuits in this power domain, transitions on Input Node 433 may arrive at Output Node 435*a* before they arrive at Output Node 435*b*. In some embodiments, a difference in arrival time of the input signal transitions at the output nodes may cause improper operation of IC 400.

FIG. 4B shows another embodiment of an IC including signal paths from one input signal to two output signals. The signal paths in IC 430 are similar to those in IC 400, with the exception of replacing Delay Circuits 403*c* and 403*d* with Voltage-Controlled Delay Circuits 404*a* and 404*b*.

Voltage-Controlled Delay Circuits 404*a-b*, in the illustrated embodiment, may correspond to INV 201 or INV 221 shown in FIGS. 2A and 2B. The total number of delay circuits in each of the signal paths to Output Nodes 435*a-b* remains the same as for IC 400. Now, however, if the voltage level of VDD1 410 drops below the voltage level of VDD2 411, then Voltage-Controlled Delay Circuits 404*a-b* may have delay times that track with the delay circuits in VDD1

Power Domain 420, such as Delay Circuits 403h-i. The signal path to Output Node 435a, therefore, includes two delay circuits (403a-b) with delay times dependent on the level of VDD2 411 and four delay circuits (Delay Circuits 403e-f and Voltage-Controlled Delay Circuits 404a-b) with delay times dependent on the level of VDD1 410. The signal path to Output Node 435b similarly has two delay circuits dependent on the level of VDD2 411 (403a and 403g) and four delay circuits dependent on the level of VDD1 410 (403h-k). In the embodiment of IC 430, the delay times from Input Node 433 to each of Output Nodes 435a-b may be substantially the same even if the level of VDD1 410 falls below the level of VDD2 411.

It is noted that the embodiment of IC 400 and IC 440 in FIGS. 4A and 4B are merely examples for demonstrative purpose. Other circuit blocks have been omitted for clarity. Although two voltage domains are illustrated, the signal paths may include any suitable number of power domains.

Figure 5:
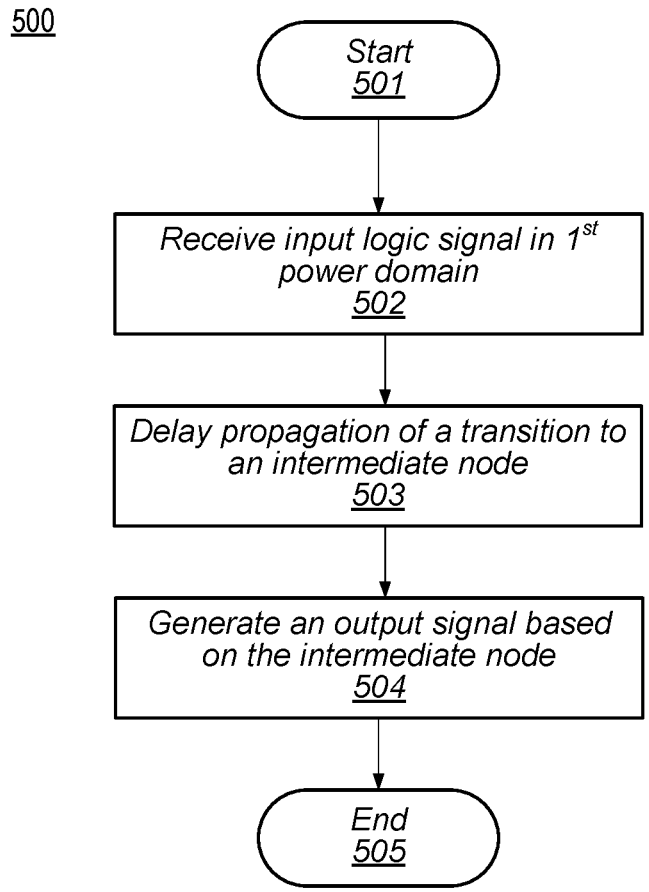
FIG. 5 illustrates a flowchart for an embodiment of a method for operating a delay circuit.

Moving now to FIG. 5, a flowchart for an embodiment of a method for operating a delay circuit is depicted. Method 500 may be applied to a voltage-controlled delay circuit, such as, for example, Voltage-Controlled Delay Circuit 102 in FIG. 1A, Voltage-Controlled Delay Circuits 200 and 220 in FIGS. 2A and 2B, and Voltage-Controlled Delay Circuits 300 and 320 in FIGS. 3A and 3B. Referring collectively to FIG. 5 and to Voltage-Controlled Delay Circuit 300 in FIG. 3A, Method 500 begins in block 501.

An input logic signal is received in a first power domain by a delay circuit (block 502). Voltage-Controlled Delay Circuit 300 receives Input Signal 312. In the illustrated embodiment, Input Signal 312 is generated in a power domain supplied by power supply signal VDD1 310, which also powers Voltage-Controlled Delay Circuit 300.

Propagation of a transition on the input logic signal to an intermediate node is delayed (block 503). In the illustrated embodiment, INV 301 delays propagation of transitions on Input Signal 312 to Intermediate Node 309, inverting the received signal in the process. The amount of the delay time is based on a slew rate signals generated by INV 301. The slew rate of the signals is based on an on-resistance of devices included in INV 301. If Input Signal 312 transitions from a logic high, to a logic low, then the delay time is based, at least partially, on the on-resistance of device Q303. Otherwise, if the transition is from a logic low to a logic high, then the delay time is based, at least in part, on the on-resistances of device Q304 and Q305. It is noted that the gate terminal of device Q304 is coupled to power supply signal VDD2 311. A voltage level of VDD2 311 may differ from a voltage level of VDD1 310. The voltage level of VDD2 311 may influence the on-resistance of device Q304, which, in turn, influences the slew rate of signals on Intermediate Node 309. If the level of VDD2 311 is sufficiently higher than the threshold voltage of device Q304, then the on-resistance may be low, resulting in a fast slew rate for signals on Intermediate Node 309. In contrast, if the voltage level of VDD2 311 is close to the threshold voltage of device Q304, then the on-resistance may be high, thereby slowing the slew rate of signals on Intermediate Node 309. The higher the on-resistance of the devices, the longer the delay time. Accordingly, the lower the voltage level of VDD2 311, the longer the delay time through INV 301 for rising transitions on Input Signal 312 (corresponding to a falling transition on Intermediate Node 309). A delay time for falling transitions of Input Signal 312 through INV 301, it is noted, may not depend on the voltage level of VDD2 311.

An output signal is generated based on a logic level of the intermediate node (block 504). An input of INV 302 is coupled to Intermediate Node 309. INV 302 generates Output Signal 314 based on the logic level of Intermediate Node 309. Similar to INV 301, INV 302 may impart an additional delay time to the detected transition before generating a corresponding transition on Output Signal 314 based on the on-resistances of devices Q306, Q307, and Q308. In the illustrated embodiment, the on-resistances of device Q306 and Q307 may be influenced by a voltage level of Intermediate Node 309. The on-resistance of device Q308, similar to device Q304, is influenced by the voltage level of VDD2 311. Similar to INV 301, INV 302 may delay propagation of rising transitions on Intermediate Node 309 based on the voltage level of VDD2 311, while falling transitions on Intermediate Node 309 may not depend on the level of VDD2 311. Since the logic level of Intermediate Node 309 is inverted from Input Signal 312, the influence of VDD2 311 may be seen in the propagation delay time of either INV 301 or INV 302 based on a direction (rising or falling) of the transition of Input Signal 312. The method ends in block 505.

It is noted that Method 500 of FIG. 5 is merely an example. In various other embodiments, more or fewer operations may be included. In some embodiments, operations may be performed in a different sequence, or in parallel.

Figure 6:
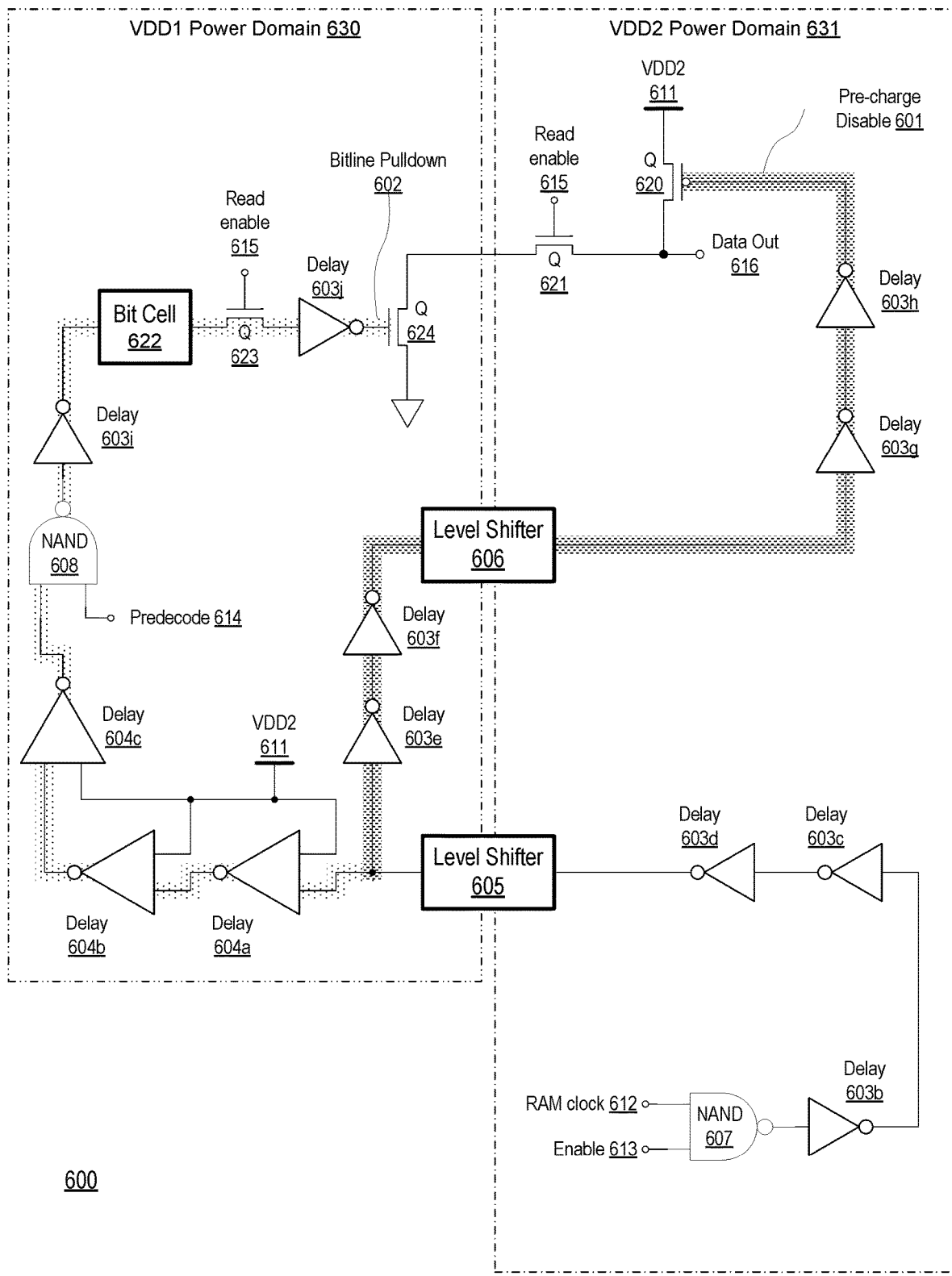
FIG. 6 shows a block diagram of an embodiment of signal paths for a clock signal traveling between two power domains.

An example of use of delay circuits is shown in Circuit 600 of FIG. 6. FIG. 6 illustrates a block diagram of an embodiment of a random access memory (RAM) controller circuit that includes two signal paths for a clock signal traveling between two power domains, VDD1 Power Domain 630 and VDD2 Power Domain 631. One of the two signal paths is used to assert Pre-charge Disable 601, and the other signal path is used to assert Bitline Pulldown 602. A clock signal, RAM Clock 612, is used to generate both Pre-charge Disable 601 and Bitline Pulldown 602. Both signal paths include Delay Circuits 603a-d, as well as logic gate NAND 607 and Level Shifter 605. At the output of Level Shifter 605, the two paths branch. The path of Pre-charge Disable 601 includes Delay Circuits 603e-h and Level Shifter 606, while the path of Bitline Pulldown 602 includes Voltage-Controlled Delay Circuits 604a-c, Delay Circuits 603i-j, logic gate NAND 608, Bit Cell 622 and device Q623.

In the illustrated embodiment, to read Bit Cell 622, Pre-charge Disable 601 is low while Read Enable 615 is low, thereby enabling Q620 and charging node Data Out 616 towards the voltage level of VDD2 611. Bitline Pulldown 602 is also low, disabling Q624. After a rising transition of RAM Clock 612 propagates down both signal paths, both Pre-charge Disable 601 and Bitline Pulldown 602 transition high, disabling Q620, and enabling Q624 based on the value of Bit Cell 622. If Q624 and Q620 are both enabled at a same time during a RAM read operation, then VDD2 611 has a path to ground via three devices, Q620, Q621, and Q624. Such an occurrence is referred to herein as a "crowbar" current and creates a high current path through these three devices which may lead to a latch-up event or damage to one or more of the three devices.

To avoid this crowbar current, Bitline Pulldown 602 may be delayed such that Pre-charge Disable 601 asserts first, thereby disabling device Q620 before device Q624 is enabled. From the output of Level Shifter 605, the path of Pre-charge Disable 601 includes two delay circuits (Delay Circuits 603g-h) in VDD2 Power Domain 631, as well as Level Shifter 606, whose output may have a similar delay to Delay Circuits 603g-h. The path of Pre-charge Disable 601 also includes two delay circuits (Delay Circuits 603e-f) in VDD1 Power Domain 630. The path of Bitline Pulldown 602 includes Delay Circuits 603*i-j* and NAND 608 in VDD1 Power Domain 630, giving the path of Bitline Pulldown 602 one extra delay time in VDD1 Power Domain 630 compared to the path of Pre-charge Disable 601. This extra delay time may help avoid crowbar current.

The path of Bitline Pulldown 602 includes three delay circuits (Voltage-Controlled Delay Circuits 604*a-c*) in VDD2 Power Domain 631 to correspond to the delay times of Delay Circuits 603*g-h* and Level Shifter 606. Voltage-Controlled Delay Circuits 604*a-c*, in the illustrated embodiment, may correspond to INV 201 or INV 221 in FIGS. 2A and 2B. Use of such delay circuits may allow the total delay time for asserting Bitline Pulldown 602 to remain longer than the total delay time for asserting Pre-charge Disable 601 when the voltage level of VDD2 Power Domain 631 fluctuates higher or lower.

It is noted that FIG. 6 is merely one example for demonstrating use of delay circuits. In other embodiments, circuit design choices may result in various combinations of delay circuits and other circuit components.

Figure 7:
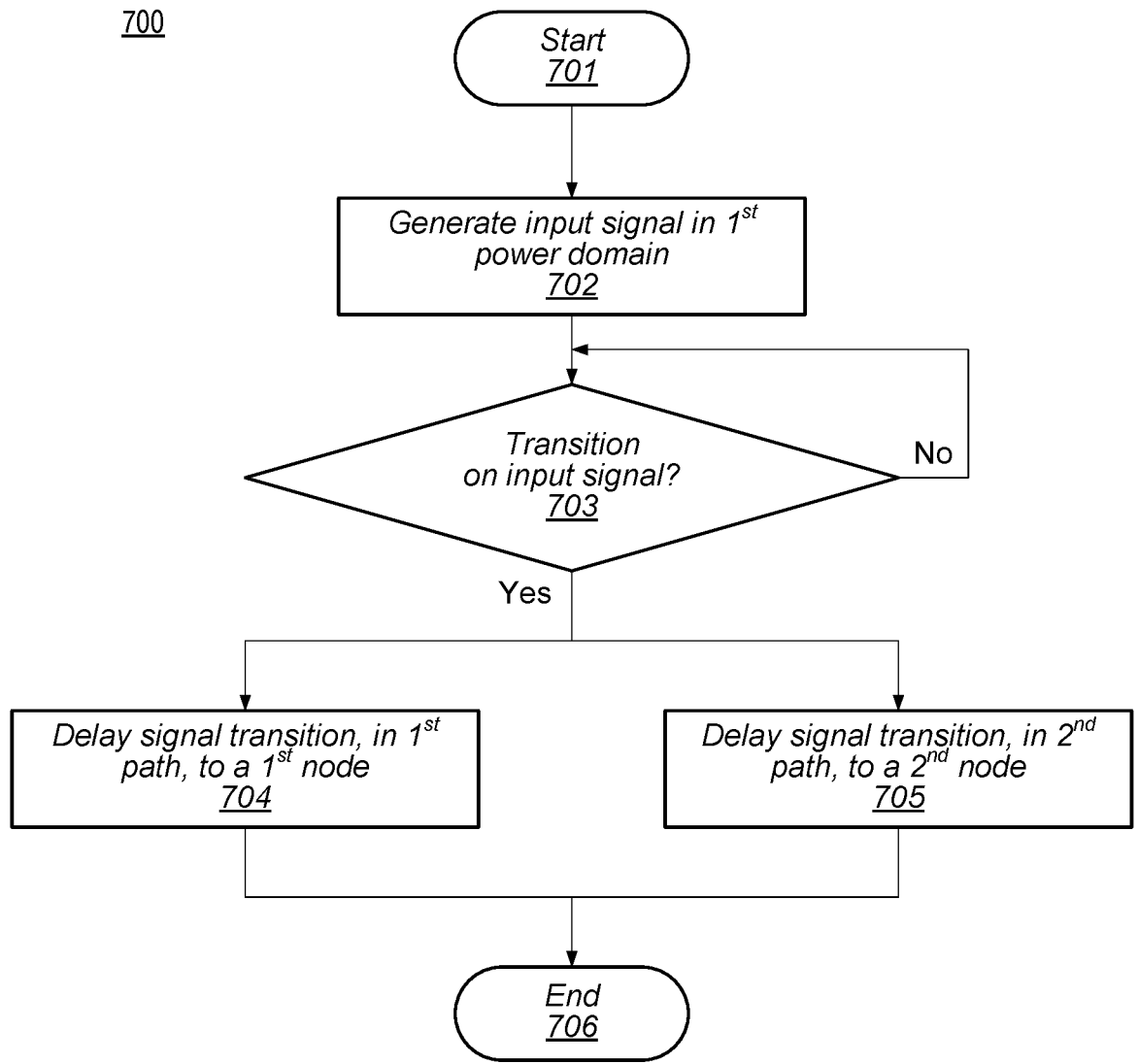
FIG. 7 depicts a flowchart for an embodiment of a method for delaying a signal traveling between two power domains.

Turning to FIG. 7, a flowchart for an embodiment of a method for delaying a signal traveling between two power domains is depicted. Method 700 may be applied to a circuit that includes two or more signal paths, such as, for example, Circuit 600 in FIG. 6, or IC 440 in FIG. 4B. Referring collectively to FIGS. 6 and 7, Method 700 begins in block 701.

An input signal is generated in a first power domain (block 702). In one embodiment, RAM Clock 612 is generated in VDD2 Power Domain 631 by any suitable clock generation circuit. In some embodiments, RAM Clock 612 may be gated, such as by the combination of NAND 607 and Enable Signal 613. RAM Clock 612 may pass through several delay circuits (e.g., Delay Circuits 603*b-d*) before reaching Level Shifter 605 and being shifted into VDD1 Power Domain 630. RAM Clock 612 branches into two paths at the output of Level Shifter 605, a first path corresponding to Pre-charge Disable 601 and a second path to Bitline Pulldown 602.

Further operations of Method 700 may depend on a transition of the input signal (block 703). In the illustrated embodiment, RAM Clock 612, when enabled, transitions between high and low logic values at a suitable frequency for reading a RAM memory. Transitions of RAM Clock 612 are delayed before reaching devices Q620 and Q624. If no transition occurs, then the method remains in block 703. Otherwise, the method moves to blocks 704 and 705 to delay RAM Clock 612 along each of the two signal paths.

A detected transition on the input signal is delayed for a first delay time to a first node (block 704). Delay Circuits 603*e-h* as well as Level Shifter 606, in one embodiment, delay the detected transition of RAM Clock 612 to Pre-charge Disable 601 for a first amount of delay time. If the transition is a rising transition, then the delayed transition may determine when device Q620 is disabled, thereby ceasing a pre-charge operation of Data Out Node 616.

The detected transition on the input signal is delayed for a second delay time to a second node (block 705). Delay Circuits 603*i-j*, NAND 608, and Voltage-Controlled Delay Circuits 604*a-c* determine an amount of delay time for the detected transition of RAM Clock 612 to reach Bitline Pulldown 602. If the transition is a rising transition, then the delayed transition may determine when Q624 is enabled (dependent on a data value of Bit Cell 622). If Q624 and Q620 are both enabled at a same time while Read Enable 615 is asserted (e.g., for a read operation), then crowbar current may result via the three devices, Q620, Q621, and Q624. To disable Q620 before Q624 is enabled, the signal path from RAM Clock 612 to Bitline Pulldown 602 may be designed to be have a longer delay time than the signal path to Pre-charge Disable 601. Since the two delay paths include a different number of delay circuits in each of VDD1 Power Domain 630 and VDD2 Power Domain 631, Voltage-Controlled Delay Circuits 604*a-c* are utilized in the signal path to Bitline Pulldown 602 to compensate for possible changes in the voltage level of VDD2 611. Each of Voltage-Controlled Delay Circuits 604*a-c* may correspond to a circuit such as INV 201 or INV 221 in FIGS. 2A and 2B. These delay circuits, in the illustrated embodiment, are coupled to VDD2 611 in VDD2 Power Domain 631. Accordingly, Voltage-Controlled Delay Circuits 604*a-c* may have delay times sufficiently close to delay times of Delay Circuits 603*g-h* and Level Shifter 606. The method ends in block 706.

It is noted that the method of FIG. 7 is an example to demonstrate the disclosed concepts. In various embodiments, operations may occur in a different order and additional operations may be included.

Figure 8:
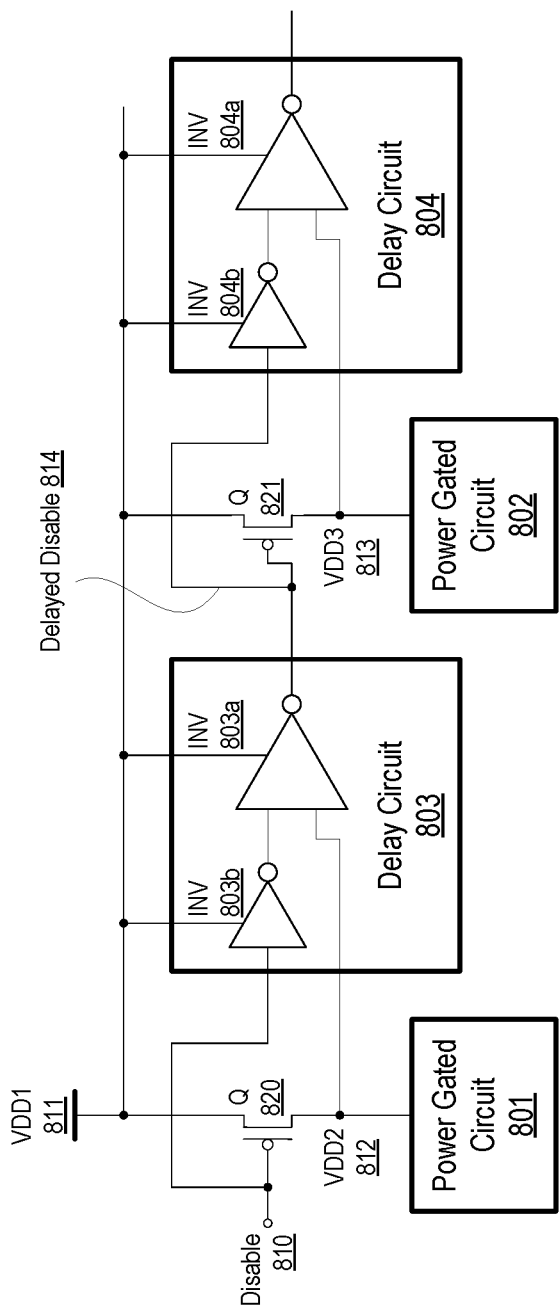
FIG. 8 illustrates a block diagram of an embodiment of a power gating circuit in an IC.

Another example of use of delay circuits is illustrated in Circuit 800 of FIG. 8, which depicts a block diagram of an embodiment of a power management circuit. Power Management Circuit 800 includes Power-Gated Circuits 801 and 802 each coupled to devices Q820 and Q821, respectively. Power Management Circuit 800 further includes Delay Circuits 803 and 804. In the illustrated embodiment, Power is enabled to both Power-Gated Circuits 801 and 802 based on a state of Disable Signal 810. In some embodiments, additional power-gated circuits may be included.

In an IC, any number of circuits may be power-gated (i.e., be isolated from a power supply to, for example, reduce power consumption when the power-gated circuits are not being used) by a given disable signal. In some embodiments, enabling multiple power-gated circuits at a same time may result in excessive in-rush current (i.e., a sudden increase in current due to, for example, circuits being enabled and creating an increased current demand on a common power supply signal). Excessive in-rush current may, in some embodiments, result in a voltage drop of a power supply signal due to current demand being greater than a current that the power supply signal can supply.

In the illustrated embodiment, Delay Circuits 803 and 804 have been included to delay a propagation of Disable Signal 810, thereby causing power-gated circuits, including Power-Gated Circuits 801 and 802, to be powered on sequentially rather than at a same time. When Disable Signal 810 is asserted, devices Q820 and Q821 are disabled, thereby isolating Power-Gated Circuits 801 and 802 from power supply signal, VDD1 811. When Disable Signal 810 is de-asserted, Q820 is enabled and current may flow from VDD1 811 to VDD2 812, thereby providing power to Power-Gated Circuit 801. Device Q821, however, remains disabled until an output of Delay Circuit 803 is de-asserted.

Delay Circuit 803 includes INV 803*a* and INV 803*b*, while Delay Circuit 804 includes INV 804*a* and INV 804*b*. Each of INV 803*a* and INV 804*a* may correspond to either INV 201 or INV 221 in FIG. 2, while INV 803*b* and INV 804*b* may correspond to either INV 202 or INV 222. In the illustrated embodiment, an input of INV 803*b* is coupled to Disable Signal 810 and therefore, generates a rising transition on its output in response to a falling transition of Disable Signal 810. Inputs of INV 803*a* are coupled to the output of INV 803*b* and VDD2 812. INV 803*a* generates a falling transition on its output, Delayed Disable Signal 814, in response to a rising transition on the output of INV 803b. Furthermore, the falling transition on Delayed Disable Signal 814 is delayed for an amount of time that is dependent on a voltage level of VDD2 812.

When Disable Signal 810 is de-asserted, device Q820 is enabled allowing the voltage level of VDD2 812 to rise. During this time, INV 803a transitions its output from low to high. If the level of VDD2 812 rises quickly, then the delay time for INV 803a to drive Delayed Disable Signal 814 low may be short, and Q821 may be enabled shortly after Q820. If, however, the voltage level of VDD2 812 rises slowly, for example, due to a high current demand from Power-Gated Circuit 801, then the delay through INV 803a may be longer, providing VDD1 811 more time to stabilize to the current demand from Power-Gated Circuit 801 before Q821 is enabled and Power-Gated Circuit 802 places an additional load on VDD1 811. Delay Circuit 804 functions similarly to Delay Circuit 803, with delays based on the falling transition of Delayed Disable Signal 814 rather than Disable Signal 810. Additional power-gated circuits may be coupled to VDD1 811 in such a sequential fashion, with each additional power-gated circuit being enabled after the preceding power-gated circuit has been sufficiently powered. In some embodiments, power-gated circuits may be ordered such that more critical circuits receive power sooner, while non-critical circuits may be placed towards an end of the power management sequence. In addition, two or more critical circuits may be configured such that they receive power in parallel, rather than sequentially.

As described above in regards to INV 201 and INV 221, INV 803a and INV 804a may delay falling transitions on their corresponding output nodes based on the voltage levels of VDD2 812 and VDD3 813, respectively. Each of INV 803a and INV 804a, however, may not delay rising transitions on their respective output nodes based on VDD2 812 and VDD3 813. When Disable Signal 810 is asserted, the delay time between each of devices Q820 and Q821 being disabled may be shorter, thereby reducing a time for the power-gated circuits to be disabled, and therefore, saving more current in some embodiments.

It is noted that the power management circuit of FIG. 8 is merely an example. In other embodiments, any suitable number of power-gated circuits and delay circuits may be employed. In some embodiments, not all power-gated circuits may be powered in the described sequential order.

Figure 9:
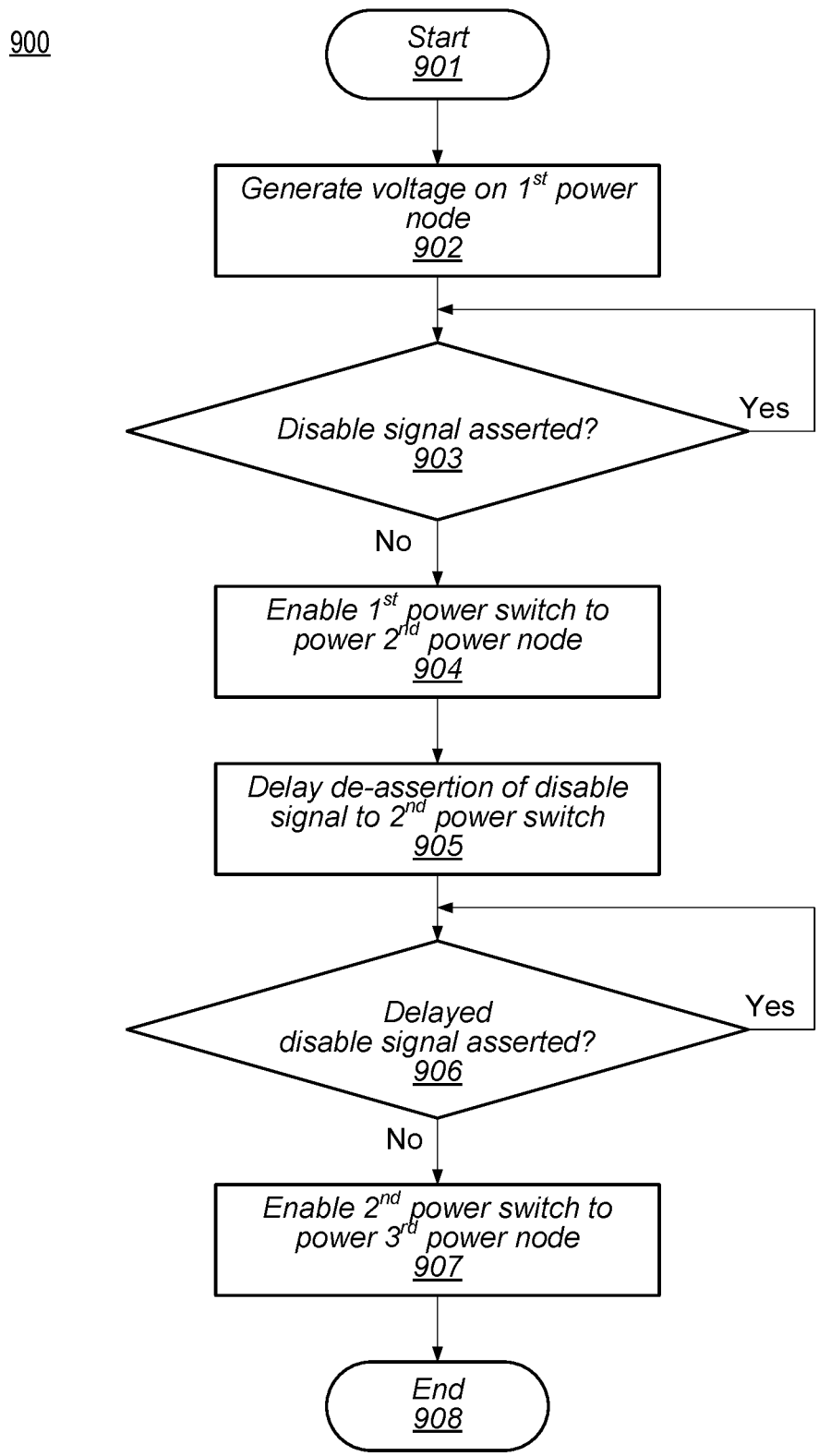
FIG. 9 shows a flowchart of an embodiment of a method for operating a power gating circuit.

Moving now to FIG. 9, a flowchart of an embodiment of a method for operating a power management circuit is shown. Method 900 may be operable on a suitable power management circuit such as Power Management Circuit 800 in FIG. 8. Referring collectively to FIG. 8 and the flowchart of FIG. 9, the method begins in block 901.

A voltage is generated on a first power node (block 902). Referring to FIG. 8, a voltage is generated on node VDD1 811. The voltage may be generated by any suitable power source or voltage regulating circuit (not shown).

Subsequent operations of Method 900 may depend on a disable signal (block 903). Disable Signal 810, when asserted, may cause devices Q820, Q821, and any additional power gating devices to be disabled, thereby gating power from corresponding power-gated circuits. If Disable Signal 810 is asserted, then the method remains in block 903. Otherwise, the method moves to block 904 to enable a first power switch.

If the disable signal is de-asserted, then the first power switch is enabled to supply power to a second power node (block 904). In response to a transition from the asserted state to the de-asserted state of Disable Signal 810, a first power switch, such as Q820 in one embodiment, is enabled, allowing current to flow through Q820 to power node VDD2 812. A voltage level of VDD2 812 may rise at a slew rate depending on a current demand from Power-Gated Circuit 801. The more current Power-Gated Circuit 801 consumes, the slower the voltage level of VDD2 812 may rise.

Delay propagation of the de-asserted disable signal to a second power switch (block 905). In the illustrated embodiment, Delay Circuit 803 receives Disable Signal 810 and delays propagation of the de-assertion to Q821. INV 803b may first invert the falling transition of Disable Signal 810. INV 803 a receives the inverted transition as a rising transition. INV 803a delays generating a corresponding falling transition on Delayed Disable Signal 814 for a delay time that is based on the voltage level of VDD2 812. A slower rise time of the level of VDD2 812 (as compared to faster rise times of VDD2 812) may result in a longer delay time before Delayed Disable Signal 814 is de-asserted.

Further operations of the method may depend on the delayed propagation of the disable signal (block 906). In the illustrated embodiment, Delayed Disable Signal 814, when de-asserted, causes device Q821, and any subsequent power gating devices to be enabled, thereby enabling power to flow to corresponding power-gated circuits. If Delayed Disable Signal 814 is asserted, then the method remains in block 906. Otherwise, the method moves to block 906 to enable a second power switch.

If the delayed disable signal is de-asserted, then the second power switch is enabled to supply power to a third power node (block 907). In the illustrated embodiment, after Delayed Disable Signal 814 transitions from the asserted state to the de-asserted state, a second power switch, such as device Q821, is enabled, allowing current to flow through device Q821 to power node VDD3 812. Similar to VDD2 812, a voltage level of VDD3 813 may rise at a slew rate depending on a current demand from Power-Gated Circuit 802. The slew rate of VDD3 813 may influence a delay time associated with Delay Circuit 804. In some embodiments, Method 900 may repeat blocks 905 to 907 for additional power-gated circuits coupled in series to Delay Circuit 804 and beyond. Otherwise, if there are no additional power-gated circuits to enable, Method 900 ends in block 908.

It is noted that method 900 of FIG. 9 is merely an example. In various other embodiments, more or fewer operations may be included. In some embodiments, operations may be performed in a different sequence.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A system, comprising:
   a first power switch configured to couple a first power supply node of a first circuit to a power supply signal in response to a transition of a disable signal from a first state to a second state;
   a second power switch configured to couple a second power supply node included in a second circuit to the power supply signal in response to a transition of a delayed disable signal from the first state to the second state; and
   a voltage-controlled delay circuit configured to transition the delayed disable signal to the second state in response to the transition of the disable signal to the second state, wherein an amount of delay time between the transition of the disable signal and the transition of the delayed disable signal is based upon a rise time of a voltage level of the first power supply node of the first circuit.

2. The system of claim 1, wherein the voltage-controlled delay circuit is further configured to transition the delayed disable signal to the second state in response to a determination that the voltage level of the first power supply node satisfies a threshold voltage level.

3. The system of claim 1, further comprising a first power-gated circuit coupled to the first power supply node and a second power-gated circuit coupled to the second power supply node.

4. The system of claim 1, wherein the first state is an asserted state and the second state is a de-asserted state.

5. The system of claim 1, wherein the voltage-controlled delay circuit includes a first inverting circuit that is coupled to the power supply signal and is configured to, source current to an intermediate node in response to the transition of the disable signal.

6. The system of claim 5, wherein the voltage-controlled delay circuit includes a second inverting circuit that is coupled to the power supply signal and to the first power supply node, wherein the second inverting circuit is configured to sink a current from an output node based upon the voltage level of the first power supply node.

7. The system of claim 1, the voltage-controlled delay circuit is further configured to transition the delayed disable signal to the first state in response to a transition of the disable signal to the first state, and wherein the amount of delay time between the transition of the disable signal to the first state and the transition of the delayed disable signal to the first state is less than the amount of delay time between the transition of the disable signal to the second state and the transition of the delayed disable signal to the second state.

8. A method, comprising:
   generating, by a power source, a voltage level on a first power node;
   in response to determining a disable signal is transitioned from a first state to a second state, coupling, by a first power switch, the first power node to a second power node;
   transitioning, by a voltage-controlled delay circuit, a delayed disable signal from the first state to the second state in response to the transition of the disable signal, wherein an amount of delay time between the transition of the disable signal and the transition of the delayed disable signal is based on a rise time of a voltage level of the second power node; and
   in response to determining the delayed disable signal is transitioned to the second state, coupling, by a second power switch, the first power node to a third power node.

9. The method of claim 8, wherein the transitioning of the delayed disable signal includes delaying a falling transition of the disable signal to a falling transition of the delayed disable signal based on the rise time of the voltage level of the second power node.

10. The method of claim 9, further comprising sinking, by a particular power gated circuit, current from the second power node, wherein the amount of delay time between the falling transition of the disable signal and the falling transition of the delayed disable signal is based on an amount of the current sunk by the particular power gated circuit.

11. The method of claim 9, further comprising transitioning the delayed disable signal by generating a rising transition of the delayed disable signal in response to a rising transition of the disable signal.

12. The method of claim 11, wherein an amount of delay time between the rising transition of the disable signal and the rising transition of the delayed disable signal is less than the amount of delay time between the falling transition of the disable signal and the falling transition of the delayed disable signal.

13. The method of claim 8, further comprising generating, by a different voltage-controlled delay circuit, a further delayed disable signal using the delayed disable signal and a voltage level of the third power node; and
   in response to determining the further delayed disable signal is transitioned to the second state, coupling, by a third power switch, the first power node to a fourth power node.

14. A system comprising:
   a first set of logic gates included in a first logic path between a first input node and a first output node, wherein the first set of logic gates is configured to:
   receive power from a first power supply signal; and
   delay propagation of a first signal for a first delay time based on a voltage level of the first power supply signal; and
   a second set of logic gates included in a second logic path between a second input node and a second output node, wherein the second set of logic gates is configured to:
   receive power from a second power supply signal; and
   delay propagation of a second signal for a second delay time based on the voltage level of the first power supply signal; and
   wherein a number of logic gates included in the second set corresponds to a number of logic gates in the first set.

15. The system of claim 14, wherein the second delay time is longer than the first delay time when the voltage level of the first power supply signal is greater than a voltage level of the second power supply signal.

16. The system of claim 14, wherein the second delay time is longer than the first delay time when the voltage level of the first power supply signal is less than a voltage level of the second power supply signal.

17. The system of claim 14, wherein the first input node and the second input node are the same.

18. The system of claim 14, wherein the first output node is a control node of a pre-charge disable device in a random-access memory.

19. The system of claim 14, wherein the second output node is a control node of a bit-line pulldown in a random-access memory.

20. The system of claim 14, wherein the second set of logic gates include one or more voltage-controlled delay circuits, and wherein an input node of the one or more voltage-controlled delay circuits is coupled to the first power supply signal.

* * * * *